US008736849B2

(12) United States Patent
Stroessner et al.

(10) Patent No.: US 8,736,849 B2
(45) Date of Patent: May 27, 2014

(54) METHOD AND APPARATUS FOR MEASURING STRUCTURES ON PHOTOLITHOGRAPHY MASKS (75) Inventors: Ulrich Stroessner, Jena (DE); Gerd Klose, Tokyo (JP); Michael Totzeck, Schwaebisch Gmuend (DE)

(73) Assignee: Carl Zeiss SMS GmbH, Jena (DE)

( * ) Notice: Subject to any disclaimer, the term of this patent is extended or adjusted under 35 U.S.C. 154(b) by 527 days.

(21) Appl. No.: 13/062,566

(22) PCT Filed: Sep. 18, 2009

(86) PCT No.: PCT/EP2009/006752
§ 371 (c)(1),
(2), (4) Date: Jun. 27, 2011

(87) PCT Pub. No.: WO2010/031566
PCT Pub. Date: Mar. 25, 2010

(65) Prior Publication Data
US 2011/0242544 A1   Oct. 6, 2011

Related U.S. Application Data (60) Provisional application No. 61/104,345, filed on Oct. 10, 2008.

(30) Foreign Application Priority Data

Sep. 22, 2008 (DE) .......................... 10 2008 048 660

(51) Int. Cl.
*G01N 21/00* (2006.01)
*G01B 11/14* (2006.01)
*G03B 27/42* (2006.01)

(52) U.S. Cl.
USPC ........... 356/601; 356/237.5; 356/614; 355/53

(58) Field of Classification Search
USPC .................. 356/237.1–241.6, 242.1–243.8, 356/426–431, 600–640
See application file for complete search history.

(56) References Cited

U.S. PATENT DOCUMENTS 3,963,354 A * 6/1976 Feldman et al. ............... 356/394
4,218,142 A * 8/1980 Kryger et al. ................. 356/394
(Continued)

FOREIGN PATENT DOCUMENTS

WO   WO2008/071294   6/2008

OTHER PUBLICATIONS

Dieter et al, "First measurement data obtained on the new Vistec LMS IPRO4", *Proceedings of the SPIE—The International Society for Optical Engineering, SPIE, US*, vol. 6533, May 3, 2007, pp. 653301. 1-653301.7.

(Continued)

*Primary Examiner* — Gregory J Toatley
*Assistant Examiner* — Jarreas C. Underwood
(74) *Attorney, Agent, or Firm* — Fish & Richardson P.C.

(57) ABSTRACT

The invention relates to a method for measuring structures on masks (1) for photolithography, wherein firstly the mask (1) is mounted on a spatially movable platform (2). The position of the platform (2) is controlled in this case. The structure on the mask (1) is illuminated with illumination light from an illumination light source which emits coherent light. The light coming from the mask (1) is imaged onto a detection device (6) by an imaging optical unit (4) and detected. The detected signals are evaluated in an evaluation device (7) and the positions and dimensions of the structures are determined. The invention also relates to an apparatus by which these method steps, in particular, can be carried out. In this case, the accuracy of the position and dimension determination is increased by the properties of the illumination light being coordinated with the structure to be measured. For this purpose, the illumination device (3, 3') has setting means for coordinating the properties of the illumination light with the structure to be measured.

33 Claims, 8 Drawing Sheets

(56) References Cited

U.S. PATENT DOCUMENTS

| | | | |
|---|---|---|---|
| 4,521,068 A * | 6/1985 | Schulte in den Baumen | 250/353 |
| 4,623,256 A * | 11/1986 | Ikenaga et al. | 356/394 |
| 4,668,089 A * | 5/1987 | Oshida et al. | 356/139.07 |
| 5,300,786 A * | 4/1994 | Brunner et al. | 250/548 |
| 5,357,311 A * | 10/1994 | Shiraishi | 355/53 |
| 5,576,829 A * | 11/1996 | Shiraishi et al. | 356/521 |
| 6,233,041 B1 | 5/2001 | Shiraishi | |
| 6,704,092 B2 * | 3/2004 | Shiraishi | 355/53 |
| 6,747,783 B1 * | 6/2004 | Sandstrom | 359/290 |
| 6,788,400 B2 * | 9/2004 | Chen | 356/124 |
| 7,927,090 B2 * | 4/2011 | Ten Berge | 425/150 |
| 8,423,917 B2 * | 4/2013 | Song et al. | 716/50 |
| 2002/0018192 A1 * | 2/2002 | Nishi | 355/53 |

OTHER PUBLICATIONS

Klose et al, "Photomask registration and overlay metrology by means of 193nm optics", *Proceedings of SPIE—The International Society for Optical Engineering—Photomask Technology 2008, 2008 SPIE USA*, vol. 7122, Oct. 2008.

Klose et al, "PROVE(TM) a photomask registration and overlay metrology system for the 45nm node and beyond", *Proceedings of SPIE—The International Society for Optical Engineering—Photomask and Next-Generation Lithography Mask Technology XV 2008 SPIE US*, vol. 7028, Apr. 2008.

Klose et al, "High-resolution and high-precision pattern placement metrology for the 45nm node and beyond", *Proceedings of SPIE—The International Society for Optical Engineering—EMLC 2008—24th European Mask and Lithography Conference 2008 SPIE US*, vol. 6792, Jan. 2008.

* cited by examiner

METHOD AND APPARATUS FOR MEASURING STRUCTURES ON PHOTOLITHOGRAPHY MASKS

This application is the National Stage of International Application No. PCT/EP2009/006752, filed Sep. 18, 2009, which claims priority to German Application No. 10 2008 048 660.4, filed Sep. 22, 2008 and to U.S. Provisional Patent Application Ser. No. 61/104,345, filed on Oct. 10, 2008. The contents of the above applications are incorporated by reference in their entireties.

The invention relates to a method for measuring structures on masks for photolithography. In such a method, firstly the mask is mounted on a spatially movable platform; the position of the platform is controlled in this case, for example by means of laser interferometry or other high-precision measurement technology. The structure on the mask is then illuminated with illumination light from an illumination light source which emits in general coherent light. Light coming from the mask is imaged onto a detection device by an imaging optical unit and detected as an image at said detection device. The detected signals or the image are evaluated in an evaluation device and the positions and the dimensions of the structures are determined.

The invention also relates to an apparatus for measuring structures on masks for photolithography as well. Such an apparatus comprises an illumination device with at least one illumination light source which emits coherent illumination light, and which illuminates the mask by means of an illumination beam path. It additionally comprises a spatially movable platform, which receives the mask, the position of the platform being controlled, for example being controlled by means of a laser-interferometric or some other equally high-precision measuring device. Finally, the apparatus also comprises an imaging optical unit, which images light coming from the mask onto a detection device, where the light is detected as an image, and also an evaluation device coupled to the detection device, which evaluation device evaluates the detected signals of the image and determines the positions and dimensions of the structures.

Development in the production of computer chips is heading in the direction of producing smaller and smaller structures on the same area. At the present time, such chips comprise approximately thirty different layers lying one above another, and the size of the functional structures, of the so-called features, is approximately 45 nm. The photolithography masks used for producing these features have to be produced with correspondingly high accuracy. In this case, a wafer is exposed up to thirty times, but a different mask is required for each layer. For this reason, it is necessary for the masks firstly to be produced very accurately and secondly to be positioned very accurately, such that the layers are aligned exactly with one another, that is to say that the registration error is very small. With regard to layers lying one above another, an accuracy of 4.8 nm has to be achieved in this case for the most recent applications. The masks, usually having a side length of 150 mm, have to be aligned with one another with said accuracy. It is essential, therefore, to produce the mask structures in the substrate that is intended to form the mask at the correct positions with respect to a reference coordinate, for example the so-called alignment marks that are used for the alignment in the scanner.

For quality control of the registration, in the prior art special structures, so-called marks, are applied on the mask, for example crosses having extents of 10×10 µm, up to a line length of 38 µm, and a line thickness of 1 µm to 8 µm on the mask. These structures are then analyzed by means of a so-called registration tool to ascertain whether they are situated at the correct positions within the permitted tolerance. One such apparatus is the IPRO3 from Vistec, by way of example. This apparatus operates with a wavelength of 365 nm. However, the accuracy that can be achieved therewith is not high enough for future structures.

In addition, these special marks are comparatively large. Since between one hundred and four hundred of such marks are generally produced on a mask, a relatively large amount of space is occupied by these structures—it is often the case, therefore, that these control structures can only be applied at the mask edge. For this reason, it is desirable to measure the registration not only at the registration marks but in particular also and if appropriate exclusively at the design structures which ultimately fulfill a specific function on the chip. The sizes of these structures are significantly smaller, however; they are of the order of magnitude of 85 nm, for example; the half-pitch on the mask is 120 nm.

The registration tool usually uses a wavelength of between 193 and 400 nm. The structures on the mask are therefore smaller than the wavelength. In order to be able to measure such small structures with high accuracy, an optical system having very high resolution is needed. There are various possibilities for achieving this.

By way of example, the wavelength can be shortened. For technical reasons, however, it is very difficult to use a wavelength of less than 193 nm, and so there is a certain limit here at the present time.

Another possibility exists in enlarging the numerical aperture (NA). However, since many lasers which emit light having a wavelength of 193 nm have a very broadband characteristic—with a full width at half maximum generally of 0.5 nm—it is necessary for the optical system to be chromatically corrected. This is very complicated, however, in the case of optical systems having a large numerical aperture. In addition, in mask qualification there is the task of measuring the mask after a protective pellicle has additionally been applied to the mask, said pellicle being intended to prevent particles from passing directly onto the mask and leading to imaging aberrations. Possible effects of the pellicle likewise have to be taken into account. By way of example, in these cases the inspection can take place only at a working distance that is greater than the distance between the pellicle and the mask, which generally lies between 3 and 7 mm. Geometry and image aberration requirements made of the optical system restrict the numerical aperture practically to a maximum of 0.7.

Under these boundary conditions, however, it becomes difficult to carry out the abovementioned measurements with sufficiently high accuracy. Thus, it is difficult, for example, to image the structures with sufficient contrast. Image aberrations, too, such as aberrations, distortions and telecentricity errors, can adversely affect the measurement accuracy.

In photolithography it is known to adapt the illumination settings to the structure that is respectively to be measured such that a maximum interference contrast arises in the unpatterned photoresist layer under a high numerical aperture. This is described for example in U.S. Pat. No. 6,704,092 and in U.S. Pat. No. 6,233,041. The interference and hence the image generation in the photoresist layer are determined here by the fact that the spatial vector interference exhibits conformity to laws. Rigorous interactions at the mask structures are indeed observed in the exposure process, since they possibly restrict the process window; moreover, they are then also increasingly taken into account as correction in the mask design. However, in comparison with pure interference effects, they play a secondary part in photolithography. The illumination angles on the mask are less than NA=0.35 in photolithography.

While in lithography a mask is imaged onto the wafer or onto the photoresist layer in highly demagnified fashion, in aerial image analysis or high-resolution registration meteorology the mask is imaged onto a detection device, generally a camera with CCD or CMOS chip, in highly magnified fashion. On account of the high imaging scale, a quasi-collimated light wave field falls onto the sensor layer. The interference phenomena which bring about the contrast in the optical image exhibit negligible 3D effects. What is significantly more important here is the electromagnetic interaction during the illumination of the structure, and also the fact that high angles of incidence occur in the illumination on the mask side. Therefore, 3D vector effects play a significant part here and, if they are not taken into account, can lead to undesirable inaccuracies in the position determination.

It is an object of the invention, therefore, to further develop the method described in the introduction to the effect of increasing the accuracy in the position and dimension determination for the structures to be measured.

In the case of the method described in the introduction, this object is achieved by virtue of the fact that the properties of the illumination light are coordinated with the structure to be measured. Since, unlike in the case of biological samples, knowledge about the structures to be measured is available a priori to a high extent, the illumination settings can be adapted in a targeted manner to the properties of these structures—such as material composition of its form, extent, etc. The settings concern, by way of example, the wavelength, the polarization, the intensity of the light in the case of nonlinear effects, and also the coherence, and the angular distribution in the focal plane, which can be influenced by the use of different pupil diaphragms such as e.g. dipole or quadrupole diaphragms having different pole sizes. All these properties can be coordinated with the structure to be measured.

When coordinating the properties of the illumination light with the structure to be measured, the structure interaction on the mask is to be taken into account as a central point. The optimum illumination, at which the best results are obtained or the accuracy is the highest, can be determined empirically in the registration tool itself by series of experiments. It is advantageous, however, to determine the settings of the properties of the illumination light on the basis of the results of rigorous aerial image simulations or rigorous structure calculations. This can be done on the basis of a database, for example, or else by using methods of inverse diffraction. The results can themselves also be stored in a database again, such that when new structures or similar structures are examined, it is possible to have recourse to illumination settings stored in the database.

In this case, the accuracy in the position and dimension determination can be improved in various ways.

In a first configuration of the method, the properties of the illumination light are adapted to the structure to be measured with regard to maximizing contrast in the imaging. This increases the reproducibility of the registration measurements and of the measurements of the critical dimension (CD). The contrast increase is particularly well suited to masks having low-contrast structures in the aerial image, such as, for example, processed EUVL masks or photoresist masks which have already been patterned by latent exposure. By obtaining higher contrasts in the recorded images, either the registration measurement accuracy or the measurement accuracy with regard to the critical dimension can be increased or else a higher throughput can be obtained since the measurements can be concluded more rapidly.

In a further configuration of the method, the properties of the illumination light are adapted to the structure to be measured with regard to improved control of the focus position. In this way, it is then possible, for example, to choose an afocal plane in order to be independent of defocusing errors, or else a desired focal plane in order to avoid telecentricity errors, for example, and in order ultimately to obtain a more accurate and reproducible registration measurement and/or measurement of the critical dimension (CD).

In a further configuration of the method, the properties of the illumination light are adapted to the structure to be measured with regard to improved control of the depth of focus. It is then possible, for example, to increase the depth of focus in order to increase the focus step size and thus, for a given focus step number, the focus capture range. This affords advantages if there are relatively large unevennesses on the mask, since then firstly the focus can be found more easily and more reliably and at the same time outside the focus to obtain a contrast sufficient for the reproducibility of the registration and CD measurements. On the other hand, a reduction of the depth of focus may also be useful, for example if the focus is already known in some other way—for example via autofocus—and a small capture range thus suffices. In this case it is possible to employ smaller focus step sizes, whereby the best focus (BF) can be determined more reliably. The errors which arise during the measured value interpolation to the BF are reduced as a consequence. This is advantageous particularly when the registration measurement or the CD measurement varies significantly as a function of the focus.

In a further configuration of the invention, the properties of the illumination light are adapted to the structure to be measured with regard to improved control of the telecentricity. By means of such adaptation, the telecentricity error of the imaging can be minimized or even completely eliminated. On account of telecentricity errors in the imaging, the position of structures in the imaging or in the evaluation window shifts depending on the vertical position, the z position. Defocusing errors, errors in the measurement of the z position or other vertical position uncertainties cause undesired registration and CD measurement errors in this way. These errors can be minimized or eliminated if the telecentricity error can be controlled. It can then be correspondingly taken into account as a correction variable in the evaluation, for example.

In a further configuration of the method, the properties of the illumination light are adapted to the structure to be measured with regard to determining and correcting one or more image aberrations, for example distortions and aberrations.

By way of example, the imaging optical unit generally has field-dependent aberrations which have the effect that the structures imaged onto a CCD camera have a different offset depending on the image field position. This structure-dependent field distortion can be minimized or even completely compensated for by means of a corresponding selection of the illumination settings. Registration and CD measurement errors which arise as a result of different positions of the structures in the image field can be reduced in this way and the accuracy can thus be increased. Moreover, this avoids having to determine and correct the distortion image for different structures, which is also possible in principle. These corrections can also be carried out jointly for a plurality of structures.

While the optimum consists in finding an optimum setting of the illumination parameters for each structure, in one preferred configuration of the invention the properties of the illumination light are adapted uniformly for a plurality of structures to be measured. This has the advantage, inter alia, that a change in the settings does not have to take place for each structure to be newly measured and thus time is saved and errors are avoided. One typical measurement task consists, for example, in measuring the relative position of two different structures with respect to one another. Uncorrected aberrations in the imaging optical unit have the effect that, on account of the illumination, different structure types experience a different lateral position offset in the imaging (registration offset). The selection of a specific illumination adapted to the structures enables said position offset either to be minimized or even to disappear entirely, with the result that all structure types acquire the same lateral position offset, which can then in turn be eliminated as irrelevant translation and can thus be disregarded.

In another configuration of the method, finally, for each structure to be measured, measurements are carried out with at least two mutually different settings of the illumination light. This is advantageous particularly when the optimization of individual imaging properties from among those mentioned above cannot be achieved because a lateral position offset that is different for different structure types remains on account of aberrations, by way of example. In at least two, better even more mutually different settings of the illumination light, it is possible, if appropriate, to compensate for the aberration-induced registration and CD measurement effects.

The measured values of the measurements with the different illumination settings are advantageously added to form a total measured value, wherein the measured values are weighted individually and the sum of the weights amounts to one. Preferably, the weighting factors for the weight addition are in this case determined on the basis of aerial image simulations; in this case, the selection should be made such that the imaging property to be optimized, such as contrast, depth of focus, focus position, telecentricity, etc., attains the desired value in the sum of the individual results and registration and CD measurement errors are thereby minimized or even eliminated. Here as well as in the cases described above, the sequence of optimized illumination settings can be found experimentally or by means of a simulation.

A further modification consists in carrying out a variation of the illumination settings for each of the structures, that is to say in carrying out measurements with at least two mutually different settings of the illumination light for each structure to be measured. If the imaging optical unit still has uncorrected aberrations, so-called residual aberrations, then the measured registration or CD measured value varies. If illumination settings which react sensitively and preferably also selectively to different types of aberrations are then chosen, this can be utilized to separate the residual aberrations and to determine them in this way. Knowledge of the aberrations then permits the latter either to be minimized or even eliminated physically—for example by adjustment or objective manipulation—or to be taken into account purely computationally in the result depending on the mask structure, that is to say ultimately permits a calibration to the residual aberrations to be carried out. If this calibration is carried out once for example when the equipment is set up, then registration and CD measurement errors can be minimized or even completely avoided during later operation under load.

Here, too, the selection of the illumination settings can be performed on the basis of aerial image simulations or be determined experimentally.

If the residual aberrations are known, then it is also possible, on the other hand, proceeding therefrom, to define specific structures—for example an arrangement, a critical dimension, the distance between two structures, the material, the topography, etc.—which have optimum imaging properties—such as contrast, depth of focus, structure position, minimized telecentricity error, etc.—with regard to the specific image aberrations, such that the registration and CD measurement errors are reduced and the accuracy is thus made possible. These optimized structures can furthermore then advantageously be used on masks or other substrates.

Finally, knowledge of the residual aberrations also permits optimized illumination settings to be defined for expected structures, said settings having optimized imaging properties with regard to the image aberrations, and in this way likewise permits the accuracy to be increased since the measurement errors during registration are reduced. These optimized illumination settings can then advantageously be used for example as basic settings in corresponding measuring devices for the registration and the determination of the critical dimension.

In another configuration of the method, the properties of the illumination light are analyzed by recording a spatial spectrum of the pupil plane of the observation beam path. It is thus possible for example to identify the diffraction orders lying in the pupil plane. Depending on the evaluation of these diffraction maxima, a more advantageous pupil diaphragm can be chosen, but it is also possible for example to alter the size thereof or the orientation thereof relative to the structure.

For an apparatus of the type described in the introduction, which, in particular, is suitable for carrying out the above-mentioned method steps individually or in combination, the object is achieved by virtue of the fact that the illumination device comprises setting means for coordinating the properties of the illumination light with the structure to be measured in such a way that the accuracy of the position determination is increased.

These setting means preferably comprise pupil diaphragms, such as annular diaphragms, dipole, quadrupole and multipole diaphragms, disar and quasar diaphragms, circular diaphragms, and also phase shift structures and/or polarizers, which are arranged in each case in such a way that they can be introduced into the illumination beam path individually or in combination in a pupil plane. With these setting means, for each structure it is possible to find an optimum illumination setting in which the desired imaging properties can be optimized and/or imaging aberrations can be minimized.

Preferably, the apparatus additionally comprises a database in which, for a multiplicity of structures, one or a plurality of illumination settings are stored on the basis of which the coordination is effected. Depending on which imaging property is intended to be optimized or which image aberration is intended to be corrected or controlled, one of the illumination settings can be selected, wherein the process can be automated by means of a control unit. Moreover, illumination settings which yield optimized imaging properties and/or minimized imaging aberrations for a multiplicity of structures can also be stored.

In another configuration of the apparatus, the pupil diaphragm is embodied as a micromirror array. The individual micromirrors of a micromirror array can be driven by an evaluation device, for example a personal computer. Consequently, the form of the pupil diaphragm and hence the intensity distribution in the pupil plane of the illumination beam path can be changed rapidly.

In another configuration of the apparatus, at least one of the polarizers is embodied as a segmented polarization converter. Besides linearly polarized illumination light, to a good approximation circularly polarized light can thus also be used.

It goes without saying that the features mentioned above and those yet to be explained below can be used not only in the combinations specified but also in other combinations or by themselves, without departing from the scope of the present invention.

The invention is explained in even greater detail below by way of example with reference to the accompanying drawings, which also disclose features essential to the invention. In the figures:

FIGS. 4a-g show various illumination settings, FIGS. 5a-c shows an example of the contrast increase in the case of polarized illumination.

Figure 1:
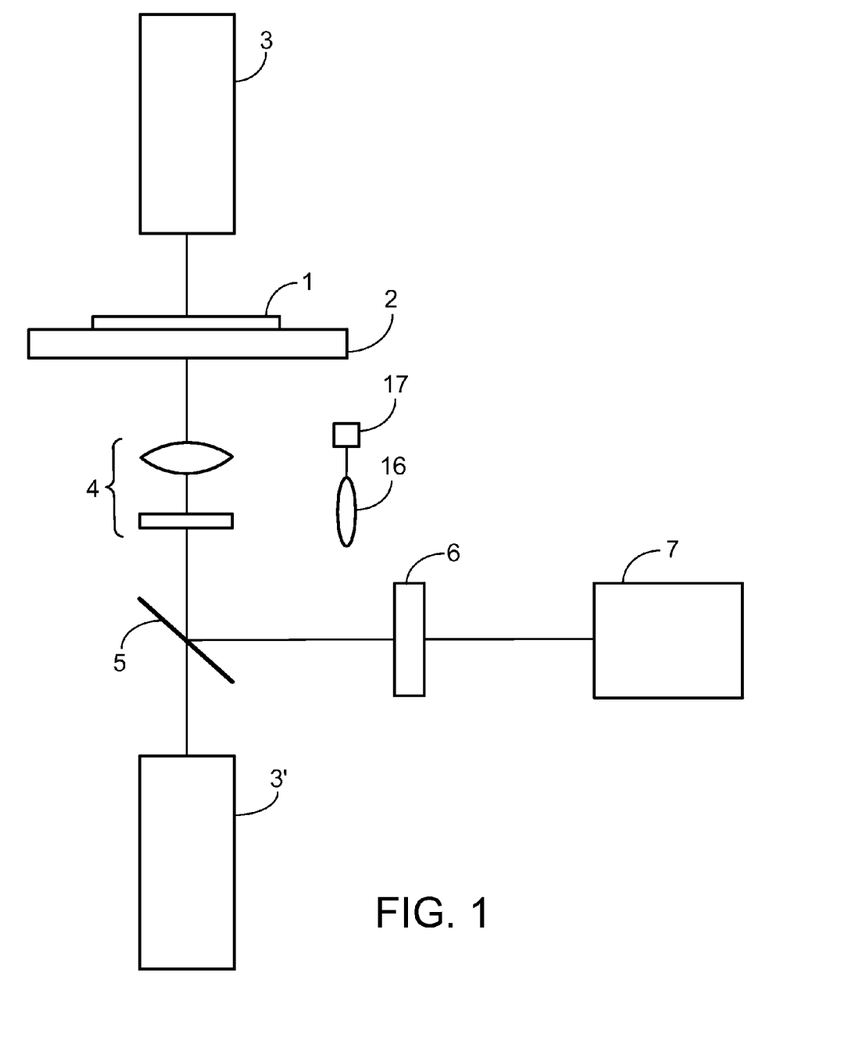
FIG. 1 shows the construction of an apparatus for measuring structures on masks for photolithography.

In the case of the apparatus shown in FIG. 1, a mask 1 for photolithography is mounted on a carrier on a platform 2. The platform 2 can be moved in three spatial directions. In order to ensure a high accuracy, the current position or the path difference is controlled by means of laser-interferometric or other high-precision measuring devices—not shown. The mask 1 and the platform 2 are arranged horizontally, that is to say perpendicular to effect of gravity. An illumination device 3 is arranged above the platform 2 with the mask 1. Said illumination device contains at least one illumination source which emits coherent illumination light and which illuminates the mask via an illumination beam path. The illumination light source can be configured as a laser, for example, which emits light having a wavelength of 193 nm. The illumination device 3 serves for the transmitted light illumination of the mask 1. Situated on the other side of the platform 2 is a further illumination device 3', which serves for the reflected light examination of the mask 1. Light which comes from the mask 1 and which is either the light that passes through the mask 1 or the light reflected therefrom is imaged onto a spatially resolving detection device 6, which can be configured as a CCD camera, by means of an imaging optical unit 4 and a semitransparent mirror 5. In said detection device, the detected intensities of the image are converted into electrical signals and communicated to an evaluation device 7.

The structures which are situated on the mask 1 which serve for checking the quality are in this case imaged by means of said detection device 6. With the aid of the position of the mask 1 determined by means of interferometry, it is possible to determine the position of the structure on the mask 1. The beam paths both for illumination and for imaging are in this case preferably implemented parallel to the gravitational force; in this way, the lenses and their mounts are subjected to the gravitational force only in the axial direction, which increases the beam guiding accuracy.

Figure 2:
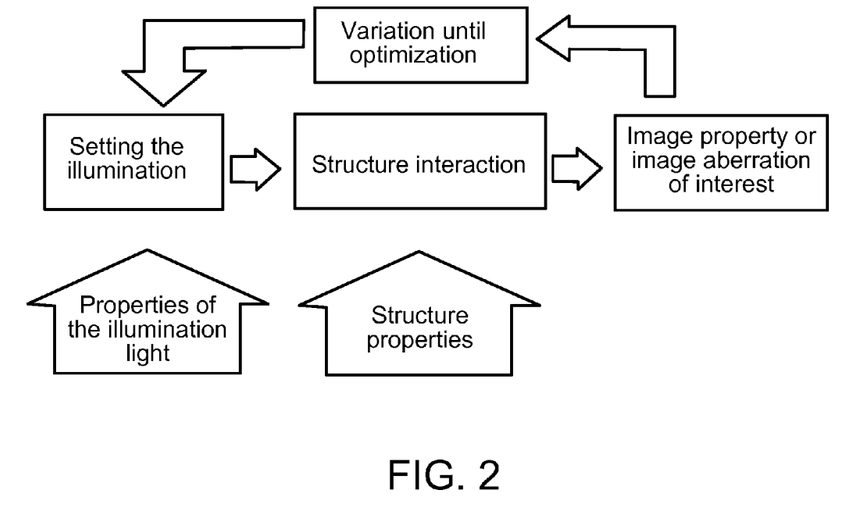
FIG. 2 shows a detailed illustration of the method step for coordinating the illumination light with the structure to be measured.

The accuracy of the position determination can be increased in this case by the properties of the illumination light being coordinated with the structure to be measured or with the structures to be measured. The procedure in this respect is outlined in FIG. 2, wherein the coordination can be effected either experimentally, that is to say by trying out different illuminations, or in a computer-aided manner with the assistance of aerial image simulations. The schematic can be employed in both cases. The first step involves setting a start configuration for the illumination light. For various properties of the illumination light, such as the wavelength, the polarization, the angular distribution and/or the intensity, settings are made which may be relevant to the illumination of the mask 1. During the illumination of the structure, the interaction of the illumination light essentially depends on the abovementioned properties of the illumination light and the properties of the structure, such as material, size and form. An image is detected with the illumination set. The detected signals, that is to say the intensity of the image, are then analyzed with regard to imaging property of interest, such as the contrast, for example, or an image aberration of interest, such as the telecentricity error, for example. If the result is not satisfactory, then by varying the illumination settings it is possible to attempt to optimize this imaging property in the representation, for example to maximize the contrast or to minimize the telecentricity error. For a given structure, entries in a database can then be created after the test series have been performed or the simulation has been concluded, such that the optimized illumination settings can be retrieved rapidly and the optimum settings can be used at any time when measuring different structures on the mask.

Figure 3:
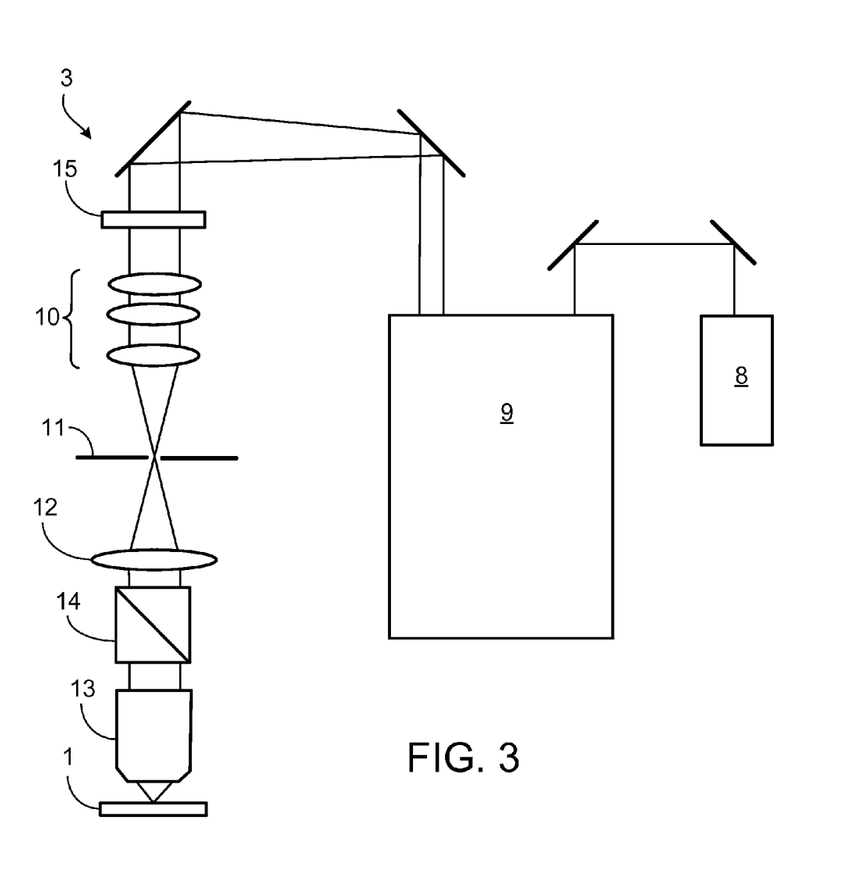
FIG. 3 shows an illumination device for such a device in detail.
Figure 3A:
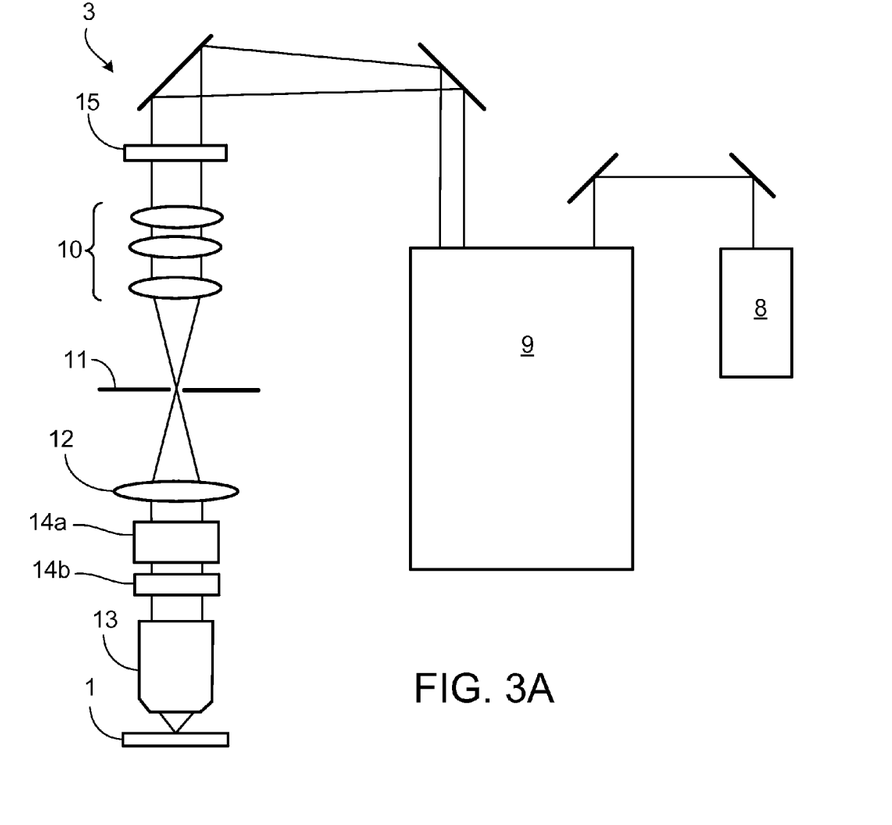
FIG. 3a shows a further illumination device for such a device in detail.

FIG. 3 illustrates the illumination device in detail. The illumination device 3' is constructed the same, in principle, as the illumination device 3 but can differ therefrom in individual settings. A light source 8 emits coherent light; the light source is preferably a laser which emits light with wavelength of 193 nm. The light emitted by the light source 8 is directed to a homogenizer 9, in which the beam is homogenized for the field plane and the pupil plane in order to generate a more uniform beam profile and thus to obtain a uniform illumination. The beam is then focused onto a field stop 11 by means of a zoom optical unit 10. Said field stop serves to set the size of the illuminated field on the mask 1 in such a way that exclusively the smallest possible region which appears the same for all structures during the imaging is illuminated. In this way, scattering effects caused by the proximity of the structures used for marking can be suppressed. The beam is then directed via a tube lens 12 and a condenser 13 onto the mask 1 and focused onto the latter. A polarizer 14 and a pupil diaphragm 15 are additionally arranged in pupil planes in the beam path. These two elements represent examples of the setting means that are used to coordinate the properties of the illumination light with the structure to be measured such that the accuracy of the position determination is increased.

Figure 3B:
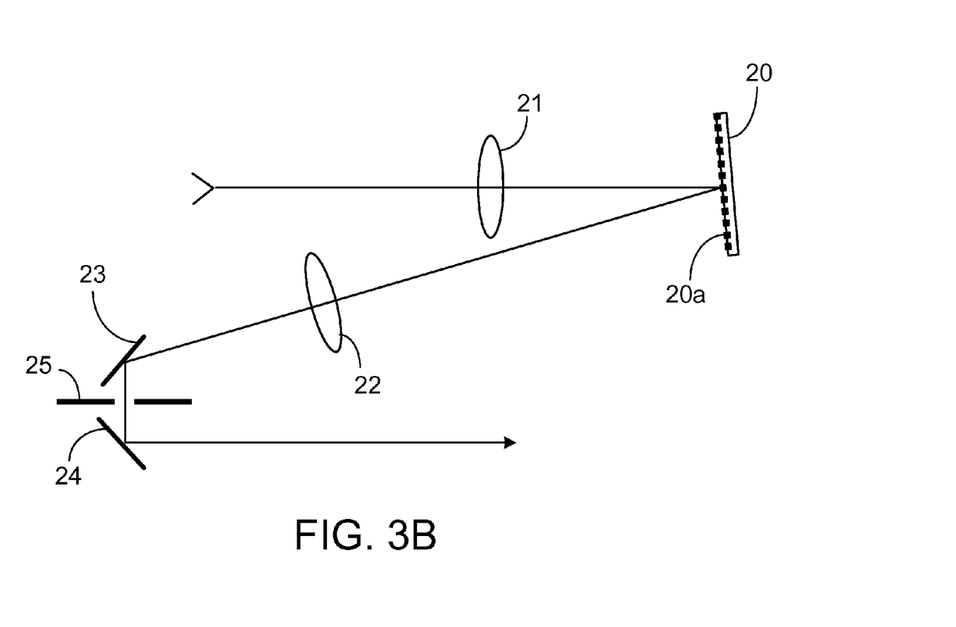
FIG. 3b shows a reflective pupil diaphragm of an illumination device for such a device in detail.

Diaphragms composed of quartz glass which are coated with chromium at light opaque layers are used as the pupil diaphragm. Reflective diaphragms such as micromirror arrays 20, for example, can also be used. The corresponding excerpt from an illumination beam path is shown in FIG. 3b. If a micromirror array 20 is arranged in a pupil plane of the illumination beam path, the individual mirrors 20a can be set in such a way that the illumination light which impinges on the mirror via an optical unit 21 is reflected in different directions and the desired intensity distribution is thus achieved. The individual micromirrors lie in a neutral position, such that they reflect illumination light without bringing about an alteration of the intensity distribution. The mirrors 20a can be deflected at very small angles, such that the micromirror array 20 can be set in such a way that illumination light is diffracted. Illumination light of the zeroth diffraction order can then pass through a field stop 25 via an optical unit 22, and illumination light of higher diffraction orders is screened out by said field stop 25. Mirrors 23 and 24 serve for deflecting the beam path in order to shorten the structural length of the illumination device 3.

Diffractive optical elements (DOE) can also be used instead of a pupil diaphragm 15. In addition, it is also possible, moreover, to use phase shift structures. Polarizer 14 and pupil diaphragm 15 are arranged, moreover, in such a way that they can be removed from the beam path and, if appropriate, can be replaced by other elements. With the aid of the pupil diaphragms 15 in the pupil beam path which transmit light only in specific regions of the pupil plane, it is possible to influence the angular distribution of the light in the focal plane where the beams interfere. Typical pupil diaphragms 15 are so-called a diaphragms, for example dipole diaphragms, quadrupole diaphragms, disar diaphragms and annular diaphragms, to mention just a few. The zoom optical unit 10 can also be interpreted as setting means since it can likewise influence the illuminated region on the mask, in particular the magnification with which the dipole diaphragm, for example, is imaged onto the structure.

The diaphragms mentioned can generally be summarized as off-axis diaphragms. In the case of the latter, σ—the ratio of the numerical aperture of the illumination device to the numerical aperture of the imaging optical unit—lies between 0.5 and 1, although the entire illumination pupil is not filled. A portion of the pupil is screened out by the diaphragms mentioned; in this way it is possible to increase the resolution by comparison with a normal microscope, in which σ is always 1.

Figure 4:
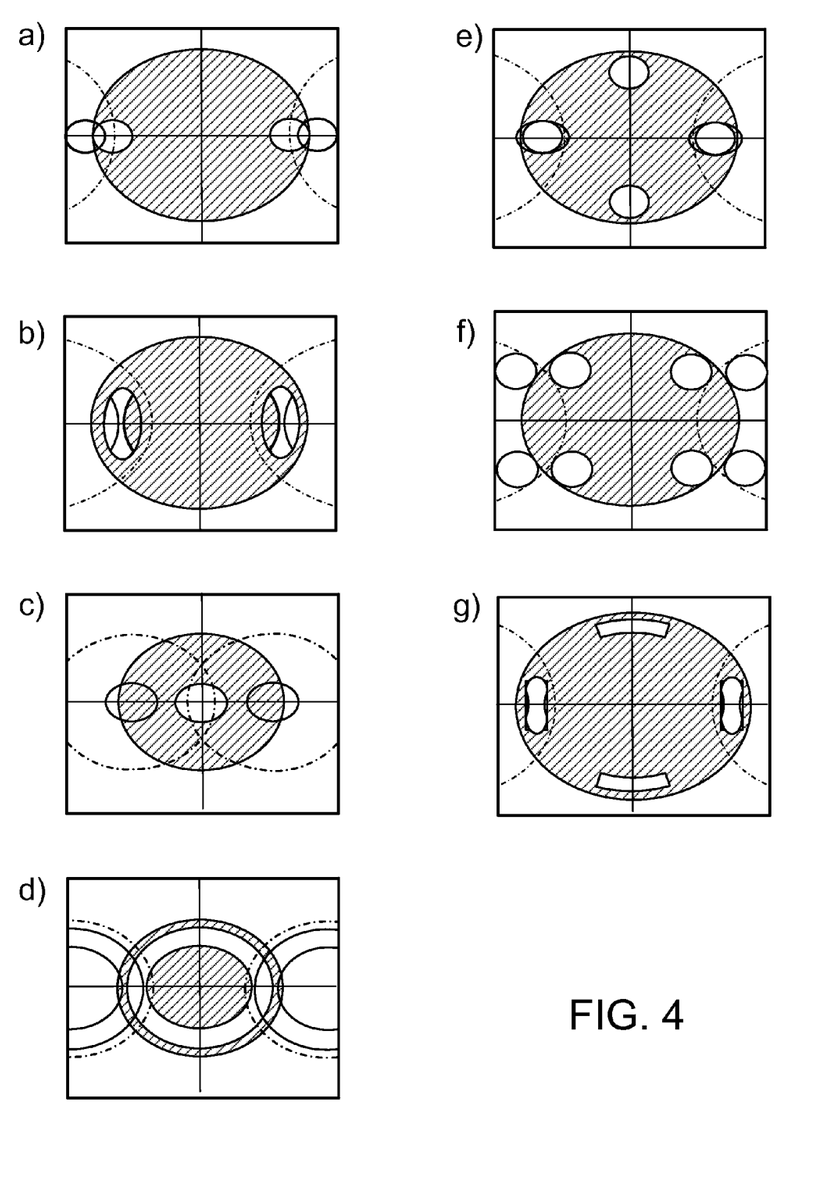

FIG. 4 shows various a diaphragms, where the outer circle around the center in each case represents the edge of the pupil, and the hatched areas inside this circle represent the region that is screened out. The dash-dotted lines/circles on the left and right indicate the −1st diffraction order (left) and the 1st diffraction order (right). The size of the imaging of the pupil diaphragm 15 can be influenced for example with the aid of the zoom optical unit.

At wavelengths of 193 nm and a numerical aperture of 0.7, 85 nm structures with a half-pitch of 120 nm are very close to the resolution limit. The contrast is very low, which normally leads to high inaccuracies in the position determination of the structures. In the case of such small structures, on the other hand, the mask acts as a diffraction grating. The zeroth diffraction order, that is to say the undiffracted order, at which the angle of incidence is maintained, is always imaged completely within the imaging pupil. The −1st and 1st diffraction orders, however, are diffracted by the mask and thus deflected. Close to the resolution limit of the optical system, even the first diffraction order is only partly within and the 2nd diffraction order is already completely outside the imaging pupil.

Contrast in the image, on the other hand, arises as a result of the interference of the various diffraction orders with one another. Only that part of the first diffraction order which lies within the pupil can contribute to the contrast. In order, therefore, to adapt the illumination settings with regard to maximizing contrast, the illumination settings should be chosen such that a largest possible proportion of the first diffraction order lies within the pupil. Which pupil diaphragms are particularly suitable for this purpose also depends on the structure of the mask; in particular, it is necessary to make a distinction between amplitude and phase shift masks. In the case of amplitude masks, contrast arises as a result of interference between the zeroth and the +/−1st diffraction order. The zeroth diffraction order should therefore lie close to the edge of the pupil, and the +/−1st order respectively at the opposite edge. A so-called off-axis setting is appropriate in this case. This is shown in FIG. 4a using the example of a dipole diaphragm, but the overlap region between zeroth and 1st and respectively −1st diffraction order is very small. The overlap region is larger in the case of the disar diaphragm illustrated in FIG. 4b. Good improvements in the contrast can be obtained in both cases, however. By means of dipole illumination, that is to say when using dipole pupil diaphragms, good contrast improvements can be obtained particularly in the case of one-dimensional structures, that is to say in the case of linear structures which are extended only in one direction. A double measurement then has to be carried out in the case of two-dimensional structures.

Other possible types of diaphragm are the quadrupole diaphragm illustrated in FIG. 4e, this diaphragm being rotated through 45° in FIG. 4f, and also the quasar diaphragm illustrated in FIG. 4g. In particular the quadrupole illumination as illustrated in FIG. 4e is advantageous in the case of amplitude masks of the CoG type (chromium on glass) if illumination is effected using unpolarized light. In the case of larger structures or numerical apertures larger than 0.6, it is also possible to use other illuminations such as quasar illumination or else annular illumination, as illustrated in FIG. 4d. These illumination settings can also be used well for EUV absorption masks.

If the pitch of a structure comprising straight lines ("lines and spaces") is known, by way of example, the corresponding pupil diaphragm can be selected in a simple manner. If the pitch or the type of structure to be measured is not known, the pitch or further properties of the structure can be determined by means of the measurement of the spatial spectrum of the imaging pupil. In order to record a spatial spectrum, that is to say the intensity distribution of the illumination light in the pupil plane, a Bertrand lens 16 is introduced into the beam path by means of drive 17. The intensity distribution is then performed by read-out of the detection device 6 by the evaluation device 7. In the abovementioned examples in FIG. 4, it is possible to identify the diffraction orders which lie in the pupil plane. The intensity can also be used for the assignment of the diffraction orders. The 0th diffraction orders have the highest intensity, for example, and the 1st and −1st diffraction orders have the second highest intensity. The pitch of a structure can be calculated from the distance between the 0th and 1st/−1st diffraction orders, and the orientation of the structure in the beam path can be calculated from the position of the maxima. Depending on the conclusion drawn, a different pupil filter may be advantageous, but it is also possible, by way of example, to correct the size of the pupil diaphragm by means of the corresponding setting of the zoom optical unit 10.

For further optimizations of pupil filters, use is made of a method referred to as "computational scaling" solution for increasing the resolution. By means of simulation programs, intensity distributions of the pupil plane of the illumination beam path are calculated in which the intensity distribution is finely gradated alongside minimum and maximum values, and corresponding pupil diaphragms are provided.

By means of a diaphragm such as corresponds to the annular diaphragm shown in FIG. 4d, the mask can also be measured in dark field illumination given corresponding configuration. This can be achieved for example if the objective has a numerical aperture of 0.7 and the condenser has a numerical aperture of 0.9 with an annular illumination with an outer numerical aperture of 0.9 and an inner numerical aperture of 0.75. The zeroth diffraction order then lies—given corresponding setting of the zoom optical unit 10, which produces a magnification different than that shown in FIG. 4d—completely outside the imaging pupil. If there are no structures on the mask, the image is completely dark. On the other hand, if there are structures on the mask, the +/−1st and +/−2nd diffraction orders pass into the pupil. Contrast arises as a result of interference between the first and second diffraction orders. Although the image is no longer similar to the object, where there are structures, on the other hand, a very good contrast is obtained.

For phase shift masks, in turn, the intensity of the diffraction order is very low and approximately zero in the ideal case. Contrast arises in this case as a result of interference between the −1st and 1st diffraction orders. An illumination with a low σ is ideally chosen, therefore, such that the zeroth diffraction order with low intensity is in the pupil center and the +/−1st diffraction orders are near to the pupil edges, as shown in FIG. 4c, for example.

The contrast can also be increased with the use of phase structures such as DOE. In this case, a phase-shifting structure which corresponds to the illumination setting and which shifts the phase by one quarter of the wavelength is introduced into the imaging aperture.

Figure 5:
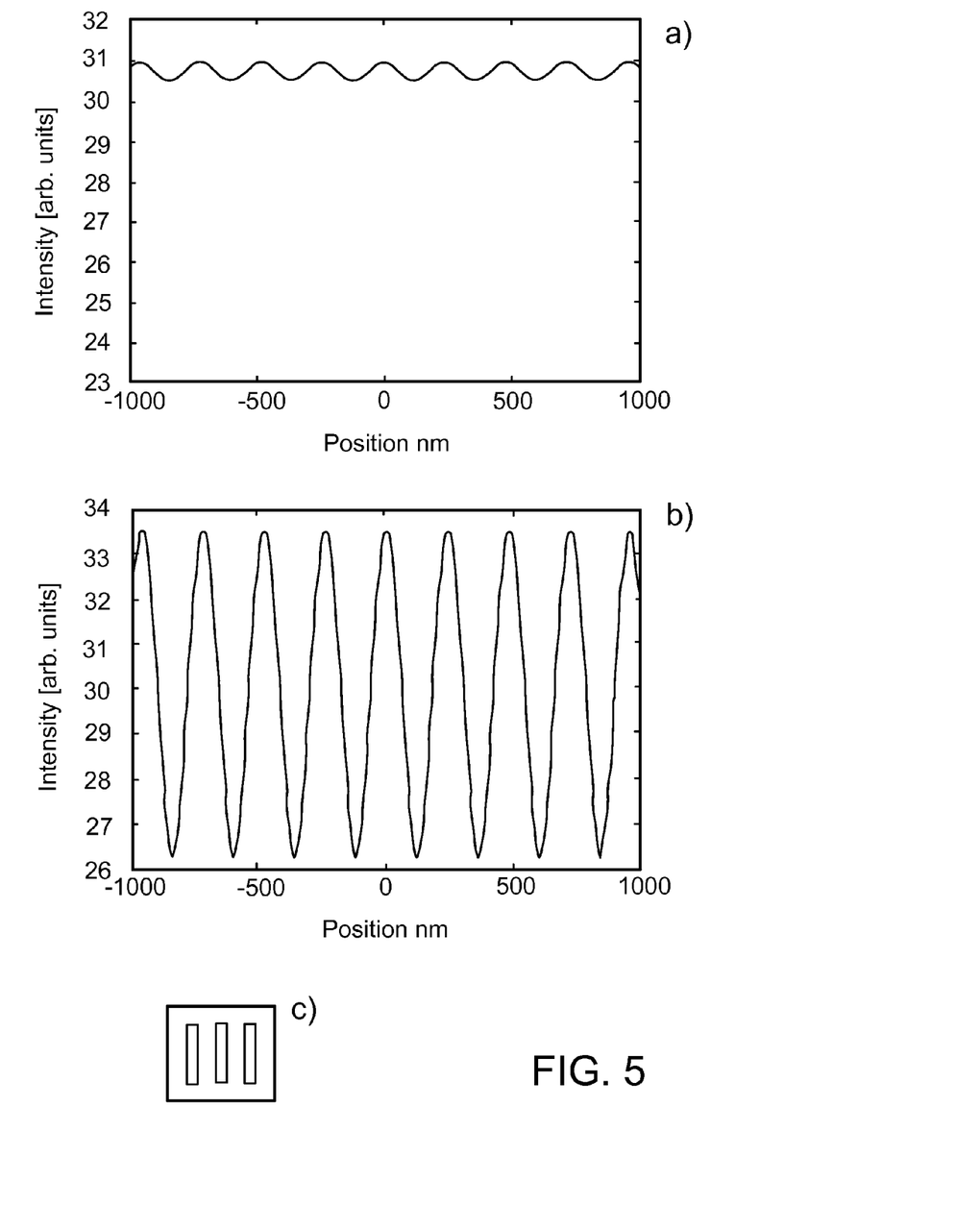

Finally, polarized illumination can also be used exclusively or supplementarily to the pupil diaphragms 15. This can be achieved by means of the polarizer 14, which can be used to set different polarizations. In the case of mask structures near or below the light wavelength, the mask can act as a partial polarizer. The mask then treats light polarized in the x direction differently than light polarized in the y direction or unpolarized light. The contrast can be optimized by selecting the polarization for which the maximum contrast is obtained. If there are linear structures in the y direction on the mask, by way of example, then a better contrast is obtained if the illumination light is likewise polarized in the y direction. The same is correspondingly applicable to the x direction. If structures lie in both directions on the mask, then tangential or radial polarization is also appropriate since the x-y symmetry is not broken with this type of polarization. One example of contrast optimization in the case of polarized illumination is illustrated in FIG. 5. Given a light wavelength of 193 nm and a line width of 85 nm and a period of the structures of 240 nm, that is to say a half-pitch of 120 nm, that is illustrated by way of example in FIG. 5c, where the lines are therefore extended in the y direction, the image shown in FIG. 5a results given a numerical aperture of 0.77 and unpolarized illumination with a ring-shaped diaphragm. The contrast shown there—the intensity is represented in arbitrary units—is too low for precise image recognition. Without an annular diaphragm, the contrast would be even lower or no longer present at all.

If light additionally polarized in the y direction is then used in addition to the annular diaphragm which generates dark field illumination or the radius of which is adapted to the pitch of the structure to be imaged, the image illustrated in FIG. 5b is obtained. The contrast is sufficient in this case. By way of example, an EUV mask was used here as the mask.

Figure 6:
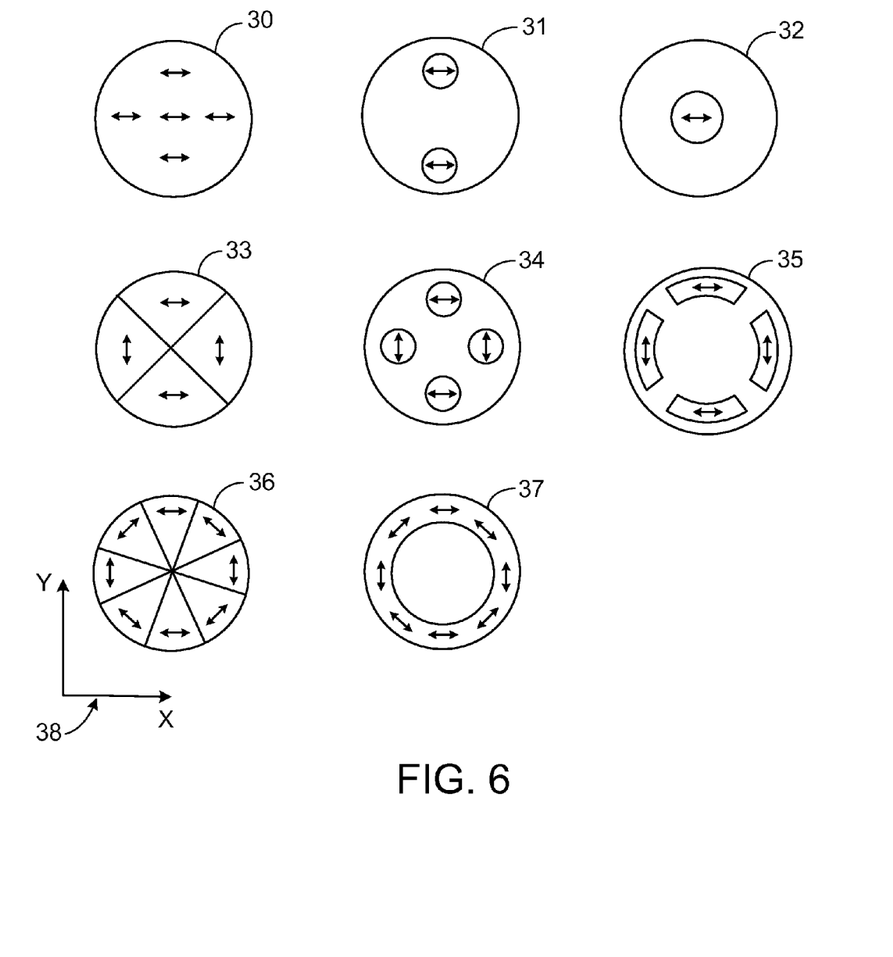
FIG. 6 shows an example of polarizers and illustration of the polarization for various illumination settings.

In a further exemplary embodiment, polarizer 14 can comprise two polarizers 14a and 14b. Polarizer 14a polarizes the projection light linearly; the polarization direction can be set by rotating the polarizer 14a. In order to achieve tangential polarization of the illumination light, in addition to the polarizer 14a the polarizer 14b, which is embodied as a segmented polarization converter, is introduced into the illumination beam path 3. The linear polarization is rotated sector by sector by said polarizer 14b, such that approximately tangential polarization results. Three variants of the polarizer 14b are available. It is possible to choose between the subdivisions into 4, 8 or 12 sectors. FIG. 6 shows the combination of polarization settings and pupil diaphragms on the basis of some examples. The polarization directions are indicated by arrows. The orientation relative to the stage coordinate system is indicated by arrows. Linear polarization 30 in the X direction may be expedient in the case of dipoles 31 or axial illumination 32. A quadruply segmented polarization converter 33 may be expedient in the case of quadrupoles 34 or quasars 35. A polarization converter 36 with 8-fold segmentation or even a polarization converter with 12-fold segmentation (not illustrated) can be used in the case of annular illumination 37.

With correspondingly different settings, focus position, depth of focus and telecentricity can be controlled and image aberrations such as distortions and aberrations can be determined and correspondingly eliminated or at least taken into account such that they can be used to calibrate the apparatus.

The invention claimed is:

1. A method for measuring structures on masks for photolithography, comprising:
   mounting a mask on a spatially movable platform,
   controlling the position of the platform,
   illuminating a structure on the mask with illumination light from an illumination light source that emits coherent light,
   imaging light coming from the mask onto a detection device by an imaging optical unit and detecting the light,
   evaluating the detected light in an evaluation device and determining the position and dimension of the structure, and
   coordinating the properties of the illumination light with the structure to be measured;
   wherein coordinating the properties of the illumination light comprises at least one of coordinating a polarization of light, coordinating an angular distribution of light by use of one or more diaphragms, coordinating a pole size of a dipole illumination, or coordinating a pole size of a multipole illumination.

2. The method as claimed in claim 1, wherein the properties of the illumination light are adapted to the structure to be measured with regard to maximizing contrast in the imaging.

3. The method as claimed in claim 1, wherein the properties of the illumination light are adapted to the structure to be measured with regard to improved control of the focus position.

4. The method as claimed in claim 1, wherein the properties of the illumination light are adapted to the structure to be measured with regard to improved control of the depth of focus.

5. The method as claimed in claim 1, wherein the properties of the illumination light are adapted to the structure to be measured with regard to improved control of the telecentricity.

6. The method as claimed in claim 1, wherein the properties of the illumination light are adapted to the structure to be measured with regard to determining and correcting one or more image aberrations or distortions.

7. The method as claimed in claim 1, wherein the properties of the illumination light are adapted uniformly for a plurality of structures to be measured.

8. The method as claimed in claim 1, wherein for each structure to be measured, measurements are carried out with at least two mutually different settings of the illumination light.

9. The method as claimed in claim 8, wherein the measured values are added in weighted fashion to form a total measured value, the weighting factors for the weighted addition being determined on the basis of rigorous aerial image simulations.

10. The method as claimed in claim 1, wherein the properties of the illumination light are set on the basis of the results of rigorous aerial image simulations of the structures to be measured and/or on the basis of databases.

11. The method as claimed in claim 1, wherein the properties of the illumination light are analyzed by recording a spatial spectrum of the pupil plane of the observation beam path.

12. An apparatus for measuring structures on masks for photolithography, comprising:
an illumination device with at least one illumination light source which emits coherent illumination light, and which illuminates the mask by means of an illumination beam path,
a spatially movable platform, which receives the mask,
a laser-interferometric measuring device, which controls the position of the platform,
an imaging optical unit, which images light coming from the mask onto a detection device, where said light is detected as an image, and
an evaluation device coupled to the detection device, which evaluation device evaluates the detected signals of the image and determines the positions and dimensions of the structures,
wherein the illumination device comprises setting means for coordinating the properties of the illumination light with the structure to be measured;
wherein the setting means comprise pupil diaphragms, the pupil diaphragms comprising at least one of annular diaphragms, dipole, quadrupole and multipole diaphragms, disar, quasar and multisar diaphragms, or circular diaphragms, the setting means also comprising phase shift structures and/or polarizers, which are arranged in such a way that they can be introduced into the illumination beam path individually or in combination in a pupil plane.

13. The apparatus as claimed in claim 12, comprising a database in which, for a multiplicity of structures, one or a plurality of illumination settings are stored on the basis of which the coordination is effected.

14. The apparatus as claimed in claim 12, wherein the pupil diaphragm is embodied as a micromirror array.

15. The apparatus as claimed in claim 12, wherein at least one of the polarizers is embodied as a segmented polarization converter.

16. A method for measuring structures on masks for photolithography, comprising:
mounting a mask on a spatially movable platform,
controlling the position of the platform,
illuminating a structure on the mask with illumination light from an illumination light source that emits coherent light,
imaging light coming from the mask onto a detection device by an imaging optical unit and detecting the light,
evaluating the detected light in an evaluation device and determining the position and dimension of the structure, and
coordinating the properties of the illumination light with the structure to be measured,
wherein the properties of the illumination light are analyzed by recording a spatial spectrum of the pupil plane of the observation beam path.

17. The method as claimed in claim 16, wherein the properties of the illumination light are adapted to the structure to be measured with regard to maximizing contrast in the imaging.

18. The method as claimed in claim 16, wherein the properties of the illumination light are adapted to the structure to be measured with regard to improved control of the focus position.

19. The method as claimed in claim 16, wherein the properties of the illumination light are adapted to the structure to be measured with regard to improved control of the depth of focus.

20. The method as claimed in claim 16, wherein the properties of the illumination light are adapted to the structure to be measured with regard to improved control of the telecentricity.

21. The method as claimed in claim 16, wherein the properties of the illumination light are adapted to the structure to be measured with regard to determining and correcting one or more image aberrations or distortions.

22. The method as claimed in claim 16, wherein the properties of the illumination light are adapted uniformly for a plurality of structures to be measured.

23. The method as claimed in claim 16, wherein for each structure to be measured, measurements are carried out with at least two mutually different settings of the illumination light.

24. The method as claimed in claim 23, wherein the measured values are added in weighted fashion to form a total measured value, the weighting factors for the weighted addition being determined on the basis of rigorous aerial image simulations.

25. The method as claimed in claim 16, wherein the properties of the illumination light are set on the basis of the results of rigorous aerial image simulations of the structures to be measured and/or on the basis of databases.

26. A method for measuring structures on masks for photolithography, comprising:
mounting a mask on a spatially movable platform,
controlling the position of the platform,
illuminating a structure on the mask with illumination light from an illumination light source that emits coherent light,
imaging light coming from the mask onto a detection device by an imaging optical unit and detecting the light,
evaluating the detected light in an evaluation device and determining the position and dimension of the structure, and
coordinating the properties of the illumination light with the structure to be measured,
wherein for each structure to be measured, measurements are carried out with at least two mutually different settings of the illumination light, and the measured values are added in weighted fashion to form a total measured value, the weighting factors for the weighted addition being determined on the basis of rigorous aerial image simulations.

27. The method as claimed in claim 26, wherein the properties of the illumination light are adapted to the structure to be measured with regard to maximizing contrast in the imaging.

28. The method as claimed in claim 26, wherein the properties of the illumination light are adapted to the structure to be measured with regard to improved control of the focus position.

29. The method as claimed in claim 26, wherein the properties of the illumination light are adapted to the structure to be measured with regard to improved control of the depth of focus.

30. The method as claimed in claim 26, wherein the properties of the illumination light are adapted to the structure to be measured with regard to improved control of the telecentricity.

31. The method as claimed in claim 26, wherein the properties of the illumination light are adapted to the structure to be measured with regard to determining and correcting one or more image aberrations or distortions.

32. The method as claimed in claim 26, wherein the properties of the illumination light are adapted uniformly for a plurality of structures to be measured.

33. The method as claimed in claim 26, wherein the properties of the illumination light are set on the basis of the results of rigorous aerial image simulations of the structures to be measured and/or on the basis of databases.

\* \* \* \* \*

UNITED STATES PATENT AND TRADEMARK OFFICE
CERTIFICATE OF CORRECTION

PATENT NO. : 8,736,849 B2
APPLICATION NO. : 13/062566
DATED : May 27, 2014
INVENTOR(S) : Ulrich Stroessner, Gerd Klose and Michael Totzeck It is certified that error appears in the above-identified patent and that said Letters Patent is hereby corrected as shown below:

In the Specification

Column 9

Line 14, delete "a diaphragms" and insert -- σ diaphragms --

Line 30, delete "a diaphragms" and insert -- σ diaphragms --

Signed and Sealed this
Twelfth Day of August, 2014

Michelle K. Lee
*Deputy Director of the United States Patent and Trademark Office*